United States Patent [19]

Yoshikawa et al.

[11] 4,318,115
[45] Mar. 2, 1982

[54] DUAL JUNCTION PHOTOELECTRIC SEMICONDUCTOR DEVICE

[75] Inventors: Toshihumi Yoshikawa, Nara; Zempei Tani, Tondabayashi; Akira Aso, Nara; Hitoshi Kawanabe, Yamatokoriyama, all of Japan

[73] Assignee: Sharp Kabushiki Kaisha, Osaka, Japan

[21] Appl. No.: 60,188

[22] Filed: Jul. 24, 1979

[30] Foreign Application Priority Data

Jul. 24, 1978 [JP] Japan .................................. 53/90667
Jul. 27, 1978 [JP] Japan .................................. 53/92390
Aug. 15, 1978 [JP] Japan .................................. 53/99686
Sep. 28, 1978 [JP] Japan ................................ 53/120214

[51] Int. Cl.³ ............................................. H01L 27/14
[52] U.S. Cl. ........................................ 357/30; 357/52; 357/86
[58] Field of Search ............................. 357/30, 86, 52

[56] References Cited

U.S. PATENT DOCUMENTS

| | | |
|---|---|---|
| 3,443,102 | 5/1969 | Kaye .................................. 357/30 X |
| 3,484,663 | 12/1969 | Halus . |
| 3,677,280 | 7/1972 | Weckler ......................... 317/235 R |
| 3,812,518 | 5/1974 | Kurz et al. ............................. 357/30 |
| 3,987,298 | 10/1976 | Rotolante . |
| 4,011,016 | 3/1977 | Layne et al. . |
| 4,053,922 | 10/1977 | Ferro ................................ 357/30 X |

*Primary Examiner*—Martin H. Edlow
*Attorney, Agent, or Firm*—Birch, Stewart, Kolasch & Birch

[57] ABSTRACT

A photoelectric semiconductor device is disclosed which exhibits a reduced spectral sensitivity in a desired wavelength zone. An N(P) type impurity region is formed in a P(N) type semiconductor substrate to establish a first PN junction functioning as a first photodiode. A P(N) type impurity region is shallowly formed in the N(P) type impurity region to establish a second PN junction functioning as a second photodiode. When the first PN junction is shunted, the photoelectric semiconductor device shows a spectral sensitivity which is reduced in the longer wavelength zone. Contrarily, when the second PN junction is shunted, the photoelectric semiconductor device shows the spectral sensitivity which is reduced in the shorter wavelength zone.

11 Claims, 29 Drawing Figures

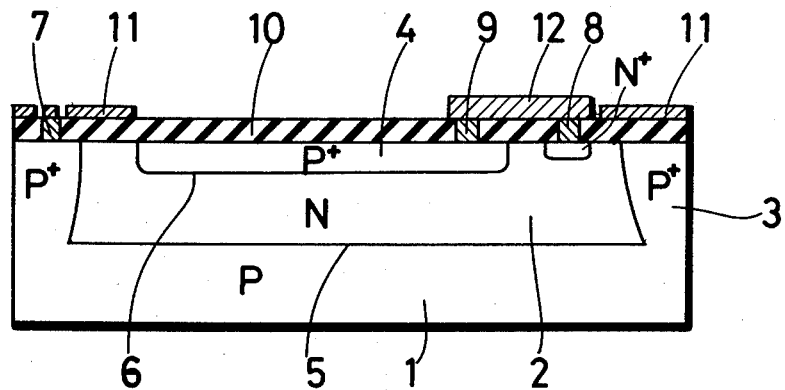

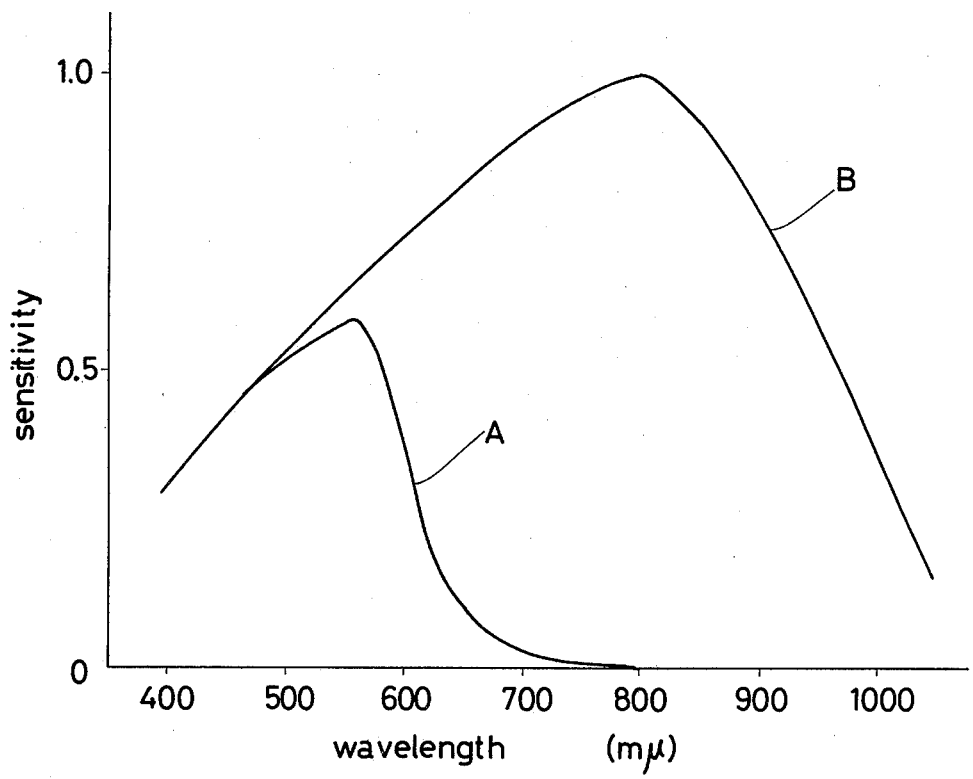
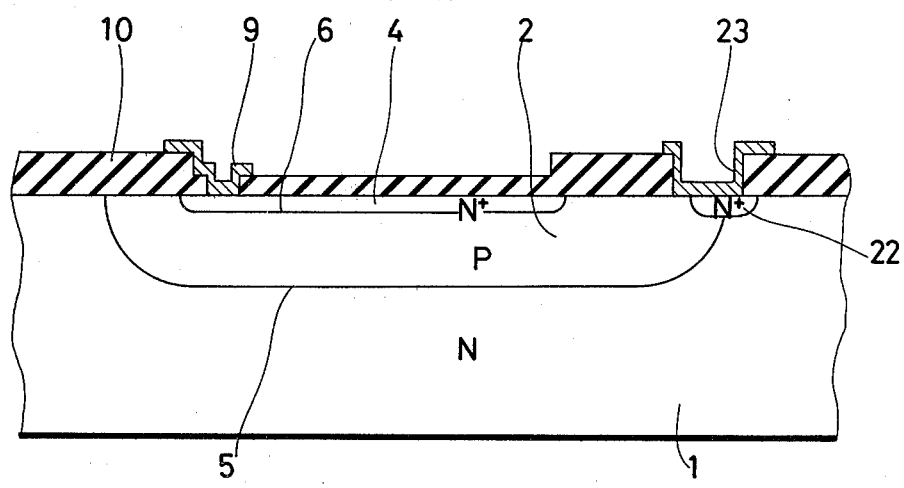

DUAL JUNCTION PHOTOELECTRIC SEMICONDUCTOR DEVICE

BACKGROUND AND SUMMARY OF THE INVENTION

The present invention relates to a photoelectric semiconductor device and, more particularly, to a dual junction photoelectric semiconductor device including at least two P-N junctions formed at different depth from the surface of the semiconductor device.

It is well known in the art that the photoelectric conversion phenomenon is observed when a light beam impinges on a semiconductor element including a P-N junction. This photoelectric conversion phonomenon is utilized in various semiconductor devices such as phototransistors, photodiodes and solar batteries.

The light absorption factor is greatly influenced by the material of the semiconductor substrate and the wavelength of the light beam impinging thereon. The light beam of a shorter wavelength is absorbed near the surface of the semiconductor substrate, whereas the light beam of a longer wavelength reaches a deeper section.

Accordingly, an object of the present invention is to provide a dual junction photoelectric semiconductor device including two P-N junctions at different depth from the surface of the semiconductor substrate.

Another object of the present invention is to enhance the spectral sensitivity of a desired wavelength range in a photoelectric semiconductor device.

Still another object of the present invention is to provide a photoelectric semiconductor device including at least two pairs of output terminals for developing output signals derived from at least two P-N junctions formed in the photoelectric semiconductor device.

Yet another object of the present invention is to provide a photoelectric semiconductor device which has a linear output characteristic over a wide range of wavelength.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, an N type impurity region is formed in a P type semiconductor substrate to establish a first P-N junction. A P type impurity region is shallowly formed in the N type impurity region to establish a second P-N junction. Output signals are derived from the P type semiconductor substrate and the N type impurity region to form a first photodiode. Output signals are also derived from the N type impurity region and the P type impurity region to form a second photodiode.

In a preferred form, the N type impurity region and the P type impurity region are shunted to reduce the spectral sensitivity in a shorter wavelength zone. In another preferred form, the P type semiconductor substrate and the N type impurity region are shunted to reduce the spectral sensitivity in a longer wavelength zone.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIG. 19 is a graph showing a spectral sensitivity characteristic of the photoelectric semiconductor device of FIG. 18;

FIG. 20 is a sectional view of a tenth embodiment of a photoelectric semiconductor device of the present invention;

DESCRIPTION OF THE PREFERRED EMBODIMENTS

Referring now in detail to the drawings, and to facilitate a more complete understanding of the present invention, photoelectric semiconductor devices of the prior art will be first described with reference to FIGS. 1 and 2.

Figure 1:
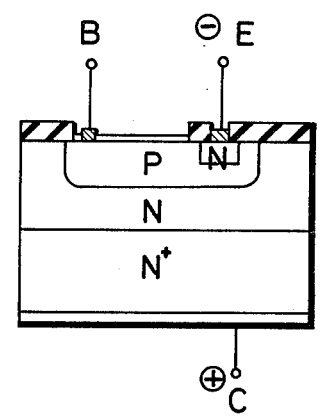
FIG. 1 is a sectional view of a phototransistor of prior art.

FIG. 1 shows a conventional phototransistor, wherein an electric current flows through a base-collector path when a light beam impinges on the base surface. To maximize the electric current, the emitter region is constructed to occupy a small area, thereby increasing the light beam impinging on the base surface. That is, in the conventional phototransistor, only the base-collector junction is utilized to perform the photoelectric conversion.

Figure 2:
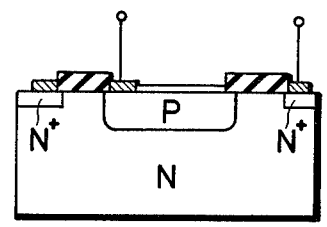
FIG. 2 is a sectional view of a photodiode of prior art.

FIG. 2 shows a conventional photodiode, which includes only one P-N junction.

In the above-mentioned photo-sensitive elements of the prior art, it is almost impossible to obtain a desired spectral sensitivity. Therefore, a filter film is disposed on the surface of the element to reduce the sensitivity in a selected wavelength zone. Accordingly, the fabrication of the semiconductor package is complicated.

The main object of the present invention is to provide a photoelectric semiconductor device, wherein a desired spectral sensitivity is obtained without employing the filter film.

Figure 3:
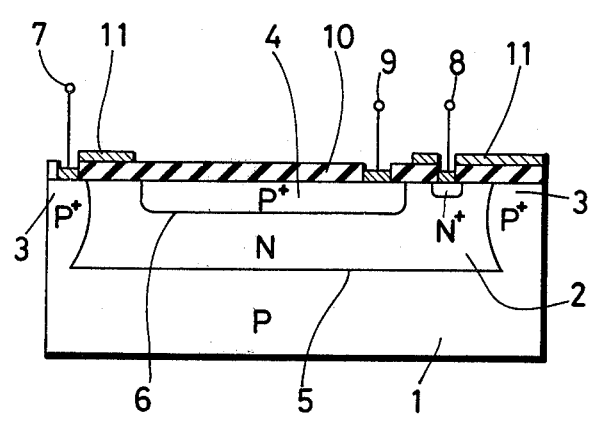
FIG. 3 is a sectional view of a first embodiment of a photoelectric semiconductor device of the present invention.
Figure 4:
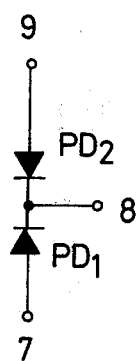
FIG. 4 is a circuit diagram of an equivalent circuit of the photoelectric semiconductor device of FIG. 3.

FIG. 3 shows a first embodiment of a photoelectric semiconductor device of the present invention. FIG. 4 shows an equivalent circuit of the photoelectric semiconductor device of FIG. 3.

The photoelectric semiconductor device of FIG. 3 mainly comprises a silicon semiconductor substrate 1 of the P type conductivity, and an epitaxial layer 2 of the N type conductivity formed in the substrate 1. The N+ buried layer can be formed in the substrate 1 at a desired position to minimize the parastic effect as is well known in the art. A P+ isolation 3 is formed to surround the N type region 2, thereby isolating the N type region 2. A P type impurity region 4 is shallowly formed in the N type region 2 through the use of diffusion techniques or ion implantation techniques.

The above-mentioned PNP three layered construction includes a first PN junction 5 formed between the semiconductor substrate 1 and the N type epitaxial layer 2, and a second PN junction 6 formed between the N type epitaxial layer 2 and the P type region 4.

The first PN junction 5 is positioned at a deeper section and responds to a longer wavelength light beam to create electron/positive hole pairs. The second PN junction 6 is positioned at a shallow section and has a considerably large size. The second PN junction 6 absorbs a shorter wavelength component to generate electron/positive hole paris.

An electrode terminal 7 is connected to the P type semiconductor substrate 1, another electrode terminal 8 is connected to the N type region 2, and yet another electrode terminal 9 is connected to the P+ region 4. The electrode terminals 7 and 8 form, in combination, output terminals of a first photodiode $PD_1$, and the electrode terminals 8 and 9 form, in combination, output terminals of a second photodiode $PD_2$.

A transparent insulator film 10 is disposed on the P+ region 4 on which a light beam impinges. An anti-halation film is more desirable to ensure effective photoelectric conversion. An opaque thin film 11 is formed on the transparent insulator film 10 at a position near the first PN junction 5 reaches the surface of the semiconductor substrate 1. The opaque thin film 11 preferably comprises an aluminum film and functions to prevent the light beam from being absorbed by the first PN junction 5 near the surface of the semiconductor substrate 1. To enhance the spectral characteristic of the photoelectric semiconductor device of the present invention, the opaque thin film 11 preferably extends to a section adjacent to a point where the second PN junction 6 reaches the surface of the semiconductor device.

Figure 5:
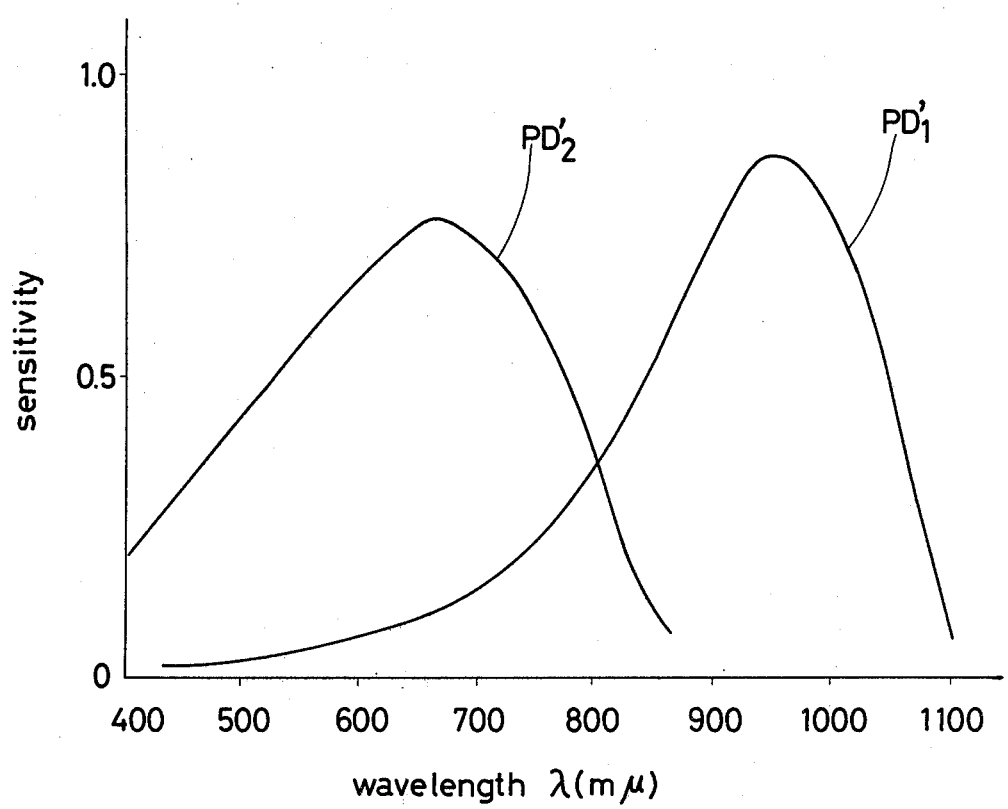
FIG. 5 is a graph showing a spectral sensitivity characteristic of the photoelectric semiconductor device of FIG. 3, wherein an opaque thin film is not formed on the photoelectric semiconductor device.
Figure 6:
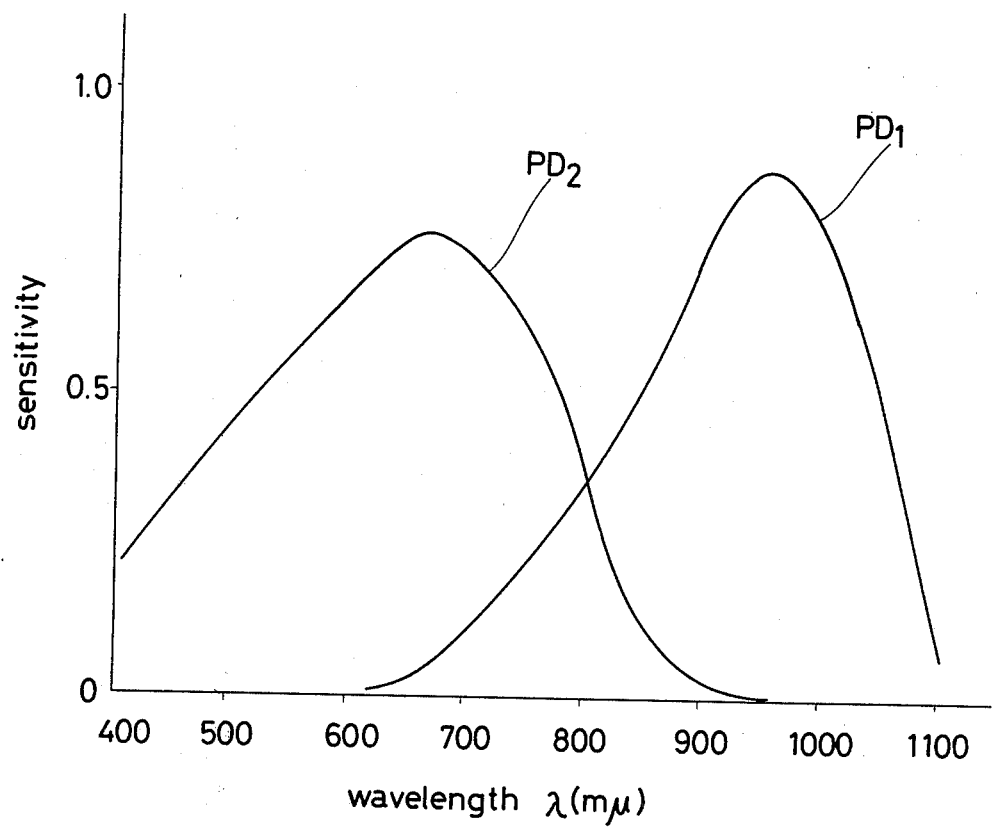
FIG. 6 is a graph showing a pectral sensitivity characteristic of the photoelectric semiconductor device of FIG. 3, wherein an opaque thin film is formed on the photoelectric semiconductor device at a desired position.

FIG. 5 shows a spectral sensitivity characteristic of the photoelectric semiconductor device of FIG. 3, wherein the opaque thin film 11 is not formed. FIG. 6 shows a spectral sensitivity characteristic of the photoelectric semiconductor device of FIG. 3, wherein the opaque thin film 11 is disposed on the transparent insulator film 10.

In FIGS. 5 and 6, $PD_1'$ and $PD_1$ represent the spectral sensitivity derived from the first PN junction 5, which have the peak at a longer wavelength side. $PD_2'$ and $PD_2$ represent the spectral sensitivity derived from the second PN junction 6, which have the peak at a shorter wavelength side. It will be clear by comparing the two curves $PD_1'$ and $PD_1$ that the opaque thin film 11 is effective to reduce the sensitivity of the first PN junction 5 in the shorter wavelength range. In FIGS. 5 and 6, when the spectral sensitivity of one photodiode is detected, the other photodiode is shunted.

Figure 7:
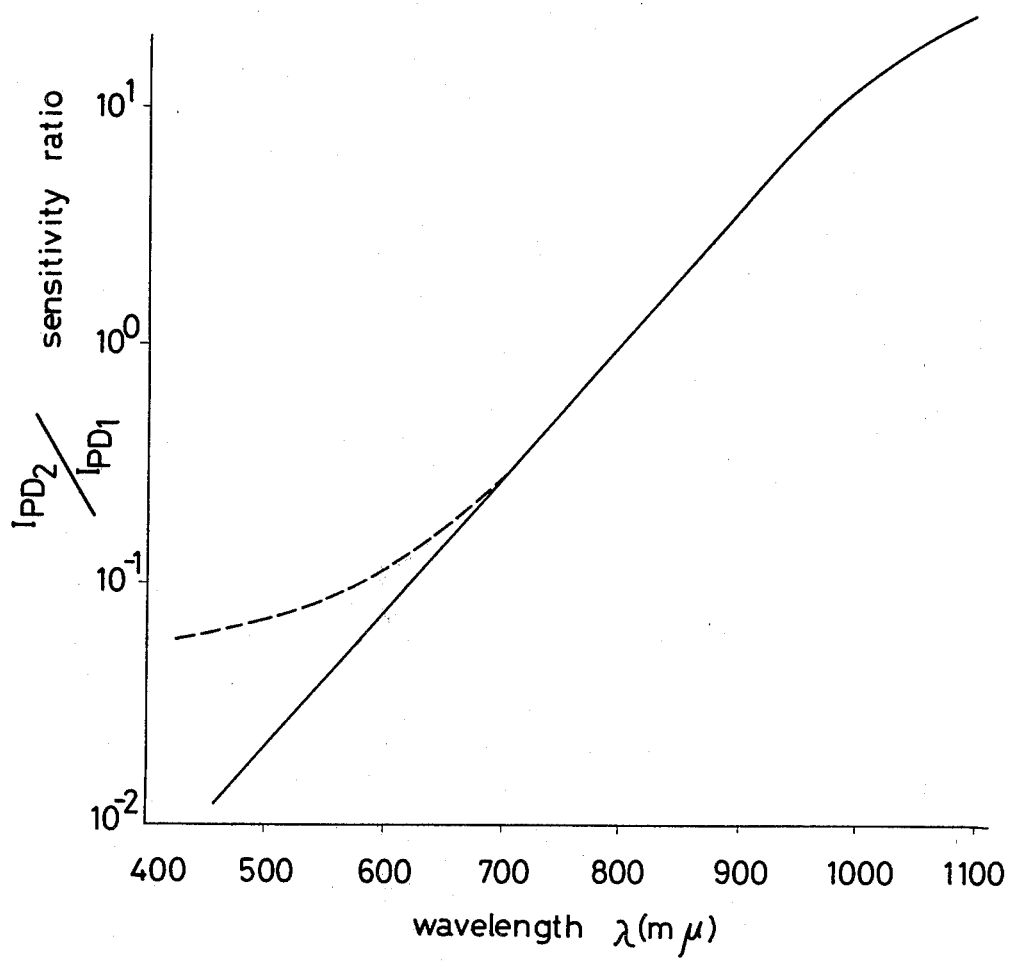
FIG. 7 is a graph showing a sensitivity ration characteristic of the photoelectric semiconductor device of FIG. 3.

FIG. 7 shows a sensitivity ratio ($IPD_2/IPD_1$) of the two photodiodes. The solid line characteristic is derived from the photoelectric semiconductor device of FIG. 3 including the opaque thin film 11, whereas the broken line characteristic is derived from the device not including the opaque thin film 11. It is clea from FIG. 7 that a linear relationship is obtained over a wide range of the wavelength when the opaque thin film 11 is disposed on the transparent insulator film 10.

The linear characteristic can be enhanced in the shorter wavelength zone when the life period of the $P^{30}$ minority carrier is lenghthened at the surface of the semiconductor device. The linear characteristic can be enhanced in the longer wavelength zone when the life period of the minority carrier is lengthened in the semiconductor substrate 1 by thickening the semiconductor substrate 1.

Figure 8:
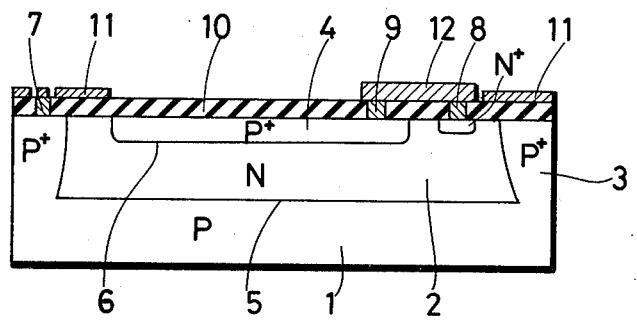
FIG. 8 is a sectional view of a second embodiment of a photoelectric semiconductor device of the present invention.
Figure 9:
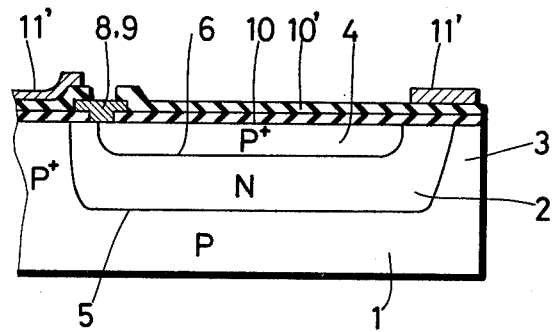
FIG. 9 is a sectional view of a third embodiment of a photoelectric semiconductor device of the present invention.
Figure 10:
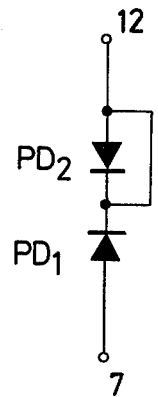
FIG. 10 is a circuit diagram of an equivalent circuit of the photoelectric semiconductor devices of FIGS. 8 and 9.

FIG. 8 shows a second embodiment of a photoelectric semiconductor device of the present invention, and FIG. 9 shows a third embodiment of a photoelectric semiconductor device of the present invention. Like elements corresponding to those of FIG. 3 are indicated by like numerals. FIG. 10 shows an equivalent circuit of the photoelectric semiconductor devices of FIGS. 8 and 9.

In the embodiment of FIG. 8, the output terminals 8 and 9 for the second photodiode $PD_2$ are shunted by an aluminum layer 12. The aluminum layer 12 is preferably integral with the opaque thin film 11.

In the embodiment of FIG. 9, an additional transparent insulator layer 10' is formed, through the use of CVD techniques, after formation of the electrodes 7, 8 and 9, thereby providing a multi-layer structure. An opaque thin film 11' is formed on the additional transparent insulator layer 10'.

When the light beam impinges on the photoelectric semiconductor device of FIG. 8, an output current is developed across the electrodes 7 and 12 in response to the light energy applied to the device. Since the second photodiode $PD_2$, which is formed at the shallower section, is shunted, the shorter wavelength component is consumed as a short-circuit current. As a result, the spectral sensitivity is greatly reduced in the shorter wavelength zone.

Figure 11:
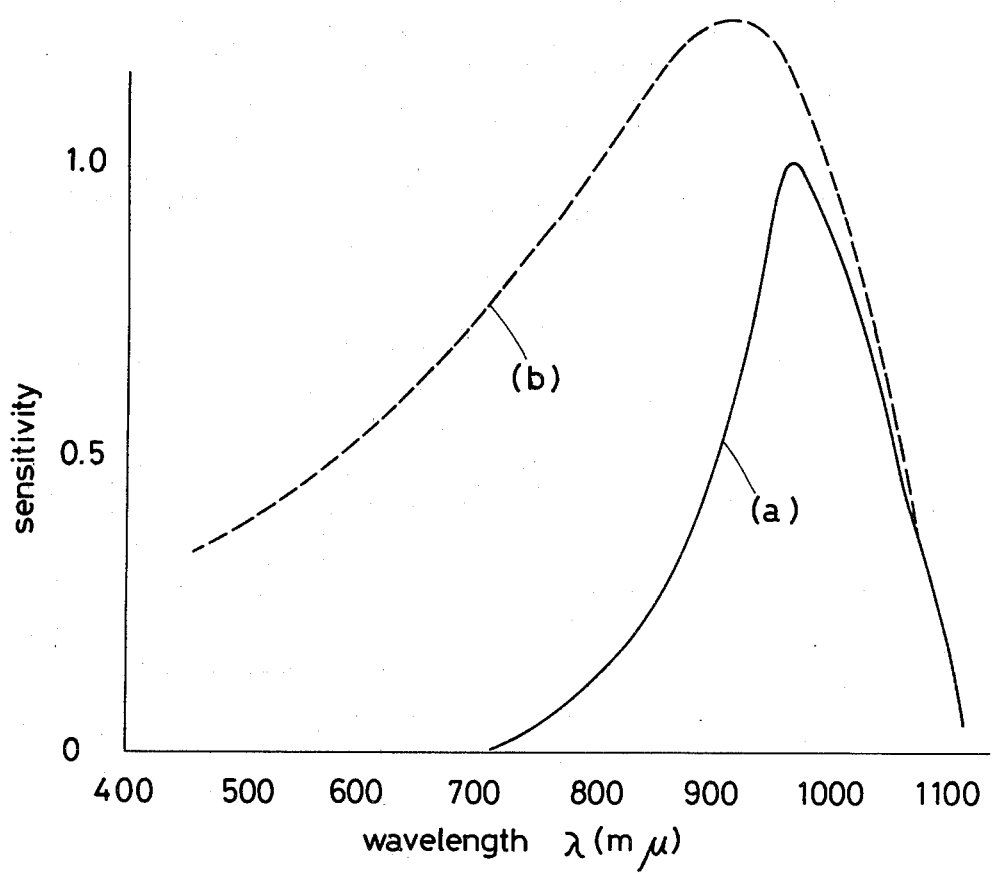
FIG. 11 is a graph showing spectral sensitivity characteristics of the photoelectric semiconductor device of FIGS. 8 and 9.

FIG. 11 shows the spectral sensitivity characteristic of the photoelectric semiconductor device of FIG. 8. The solid curve (a) represents the spectral sensitivity when the second photodiode $PD_2$ is shunted, whereas the broken curve (b) represents, for comparison purposes, the spectral sensitivity when the electrodes 8 and 9 for the second photodiode $PD_2$ are maintained at the open state. It will be clear from FIG. 11 that the spectral sensitivity is greatly reduced in the shorter wavelength zone when the second photodiode $PD_2$ is shunted. This is very effective to provide a light sensitive element having a peak level of the spectral sensitivity in the infrared zone. That is, the light sensitive element can be easily provided, which strictly responds to a signal derived from a light emitting diode without being influenced by visible rays.

Figure 12:
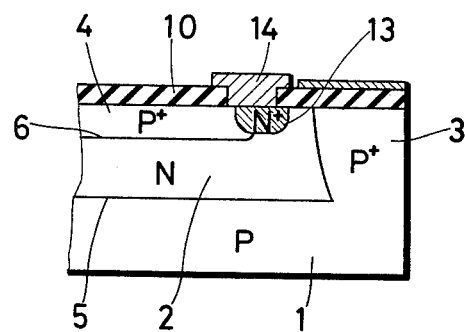
FIG. 12 is a sectional view of a fourth embodiment of a photoelectric semiconductor device of the present invention.

FIG. 12 shows a fourth embodiment of a photoelectric semiconductor device of the present invention. Like elements corresponding to those of FIG. 3 are indicated by like numerals.

An $N^+$ region 13 is formed at a section where the second PN junction 6 reaches the surface of the semiconductor device so that the $N^+$ region 13 extends across the $P^+$ region 4 and the N type epitaxial region 2. The $N^+$ region 13 can be formed by highly diffusing N type impurities. An electrode 14 is formed on the $N^+$ region 13 and the $P^+$ region 4 to connect them with each other, thereby shunting the second photodiode $PD_2$.

Figure 13:
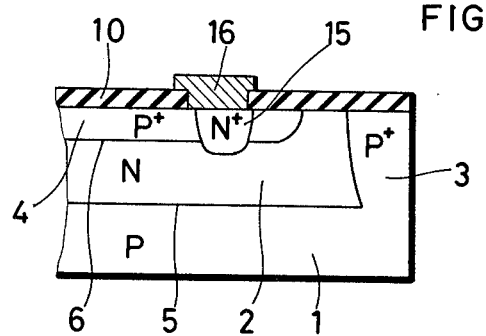
FIG. 13 is a sectional view of a fifth embodiment of a photoelectric semiconductor device of the present invention.

FIG. 13 shows a fifth embodiment of a photoelectric semiconductor device of the present invention. Like elements corrresponding to those of FIG. 3 are indicated by like numerals.

A high density diffusion $N^+$ region 15 is formed across the $P^+$ region 4 to reach the N type epitaxial region 2. An electrode 16 is formed on the high density diffusion $N^+$ region 15 to extend to the surface of the $P^+$ region 4, thereby shunting the second photodiode $PD_2$. The $N^+$ region 15 can be also formed by not diffusing the P type impurities to a selected position when the $P^+$ region 4 is formed.

Figure 14:
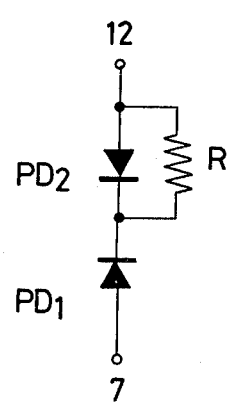
FIG. 14 is a circuit diagram of an equivalent circuit of a sixth embodiment of a photoelectric semiconductor device of the present invention.

In the embodiments of FIGS. 8, 9, 12 and 13, the second photodiode $PD_2$ is shunted. However, the second photodiode $PD_2$ can be placed in a condition which is between the shunted state and the open state by connecting the two electrodes via a resistor R as shown in FIG. 14. Of course, the resistor R can be incorporated in the semiconductor substrate.

Figure 15:
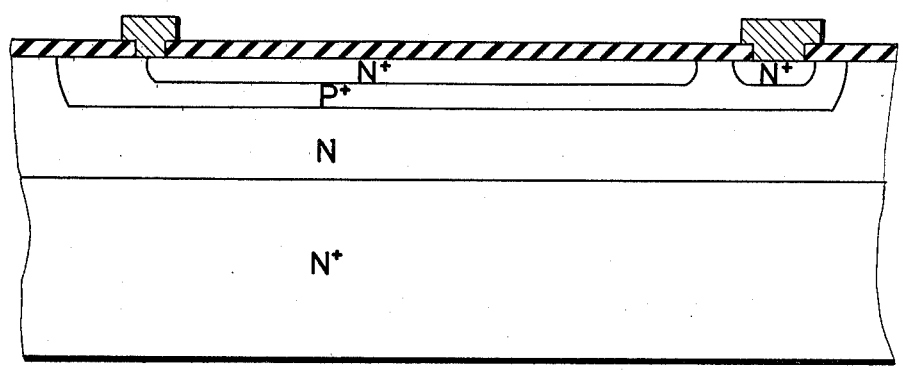
FIG. 15 is a sectional view of a seventh embodiment of a photoelectric semiconductor device of the present invention.
Figure 16:
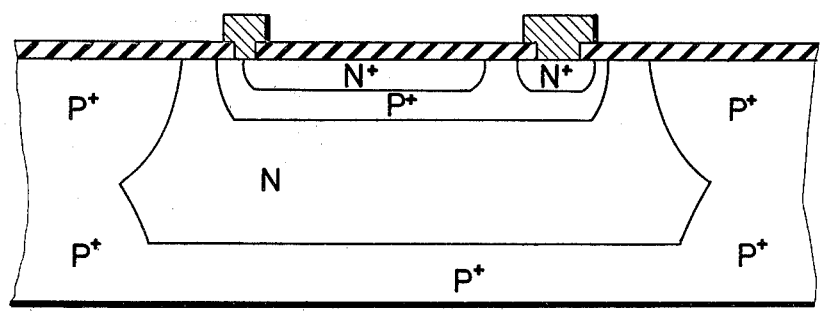
FIG. 16 is a sectional view of an eighth embodiment of a photoelectric semiconductor device of the present invention.

The photoelectric semiconductor device of the present invention is not limited to the photodiode but can be a phototransistor (FIG. 15) and a photothyristor (FIG. 16).

Figure 17:
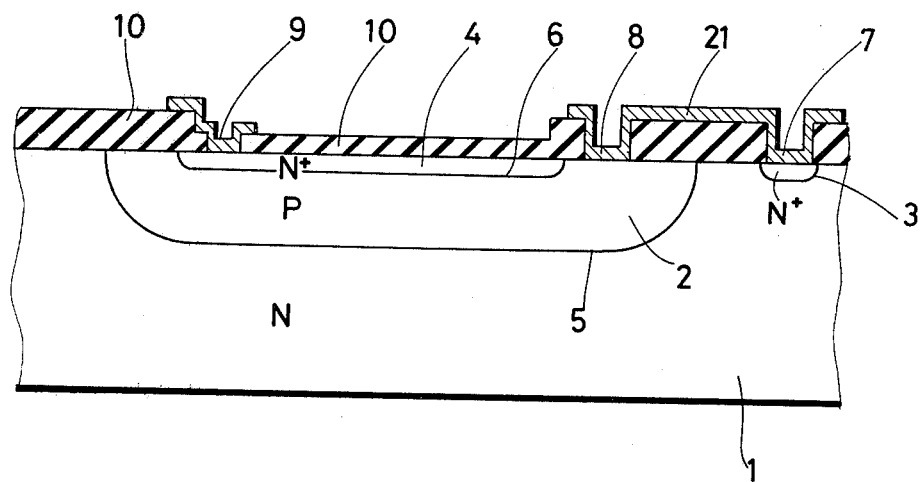
FIG. 17 is a sectional view of a ninth embodiment of a photoelectric semiconductor device of the present invention.
Figure 18:
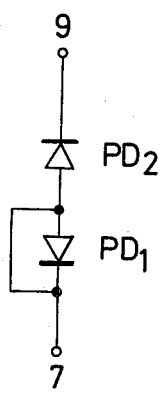
FIG. 18 is a circuit diagram of an equivalent circuit of the photoelectric semiconductor device of FIG. 17.

FIG. 17 shows a ninth embodiment of a photoelectric semiconductor device of the present invention. Like elements corresponding to those of FIG. 3 are indicated by like numerals. FIG. 18 shows an equivalent circuit of the photoelectric semiconductor device of FIG. 17.

The electrodes 7 and 8 for the first photodiode $PD_1$ are shunted by an aluminum conductor 21 formed on the transparent insulator layer 10. When the light beam impinges on the device of FIG. 17, the shorter wavelength component is absorbed at the shallow section to develop the output current across the electrodes 8 and 9 of the second photo-diode $PD_2$. The longer wavelength component is photoelectrically converted by the first photodiode $PD_1$ and consumed as the short-circuit current. Therefore, the sensitivity of the second photodiode $PD_2$ is not influenced by the photoelectric energy generated by the first PN junction 5. That is, the photoelectric semiconductor device of FIG. 17 shows a spectral sensitivity which is greatly reduced in the longer wavelength side.

FIG. 19 shows the spectral sensitivity characteristic of the photoelectric semiconductor device of FIG. 17, wherein the curve A represents the sensitivity when the first photodiode $PD_1$ is shunted by the aluminum conductor 21 as shown in FIG. 17, and the curve B represents, for comparison purposes, the sensitivity when the first photodiode $PD_1$ is placed in the open state.

It will be clear from FIG. 19 that the photoelectric semiconductor device of FIG. 17 is sensitive to the visible rays. In the embodiment of FIG. 17, the N type semiconductor substrate is employed instead of the P type semiconductor substrate. This does not substantially influence the subject matter of the present invention.

The electrodes 7 and 8 can be connected to each other through a resistor R as discussed with reference to the sixth embodiment of FIG. 14.

FIG. 20 shows a tenth embodiment of a photoelectric semiconductor device of the present invention. Like elements corresponding to those of FIG. 17 are indicated by like numerals.

A high density N type impurity region 22 is formed at a position where the first PN junction 5 reaches the surface of the semiconductor device. An aluminum conductor 23 is formed on the $N^+$ region 22 to extend to the P type region 2, thereby shunting the first photodiode $PD_1$.

Figure 21:
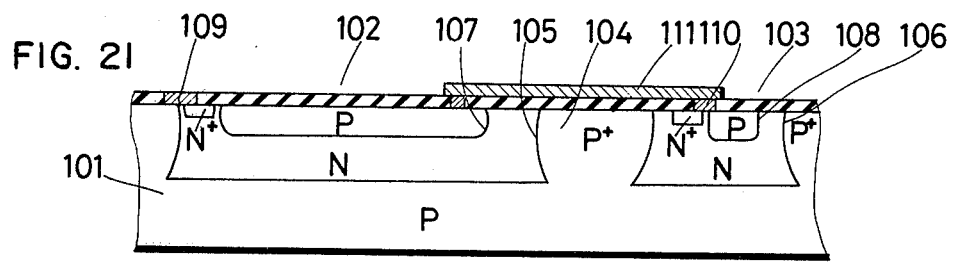
FIG. 21 is a sectional view of an eleventh embodiment of a photoelectric semiconductor device of the present invention.
Figure 22:
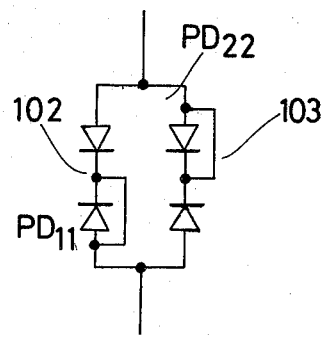
FIG. 22 is a circuit diagram of an equivalent circuit of the photoelectric semiconductor device of FIG. 21.

FIG. 21 shows an eleventh embodiment of a photoelectric semiconductor device of the present invention. FIG. 22 shows the equivalent circuit of the photoelectric semiconductor device of FIG. 21.

A first photoelectric element 102 and a second photoelectric element 103 are formed in a semiconductor substrate 101 with the intervention of a $P^+$ isolation region 104. The first photoelectric element 102 includes a first PN junction 105, and a second PN junction 107. The second photoelectric element 103 includes a first PN junction 106, and a second PN junction 108. An N+ buried layer can be formed in the N type region. Each photoelectric element 102 and 103 has a similar construction to the photoelectric semiconductor device of FIG. 3. The first photoelectric element 102 exhibits the spectral sensitivity which is reduced in the longer wavelength zone, and the second photoelectric element 103 exhibits the spectral sensitivity which is reduced in the shorter wavelength zone. More specifically, an aluminum conductor 109 is formed on the semiconductor substrate 101 at a position where the first PN junction 105 reaches the surface of the semiconductor substrate 101 thereby shunting a first photodiode $PD_{11}$ formed by the first PN junction 105. Another aluminum conductor 110 is formed on the semiconductor substrate 101 at a position where the second PN junction 108 reaches the surface of the semiconductor substrate 101, thereby shunting the second photodiode $PD_{22}$ formed by the second PN junction 108.

The spectral sensitivity of the photoelectric semiconductor device of FIG. 21 is controllable by varying the effective light receiving areas of the first and second photoelectric elements 102 and 103. The photoelectric semiconductor device of FIG. 21 is effective to reduce the spectral sensitivity in the infrared zone.

The effective light receiving area $S_2$ of the second photoelectric element 103 is selected smaller than the effective light receiving area $S_1$ of the first photoelectric element 102, for example, $S_2/S_1=0.3$. The electrode connected to the P type region of the first photoelectric element 102 is communicated with the aluminum conductor 110 of the second photoelectric element 103 via a conductor 111. That is, the two photoelectric elements 102 and 103 are connected in a parallel fashion.

Figure 23:
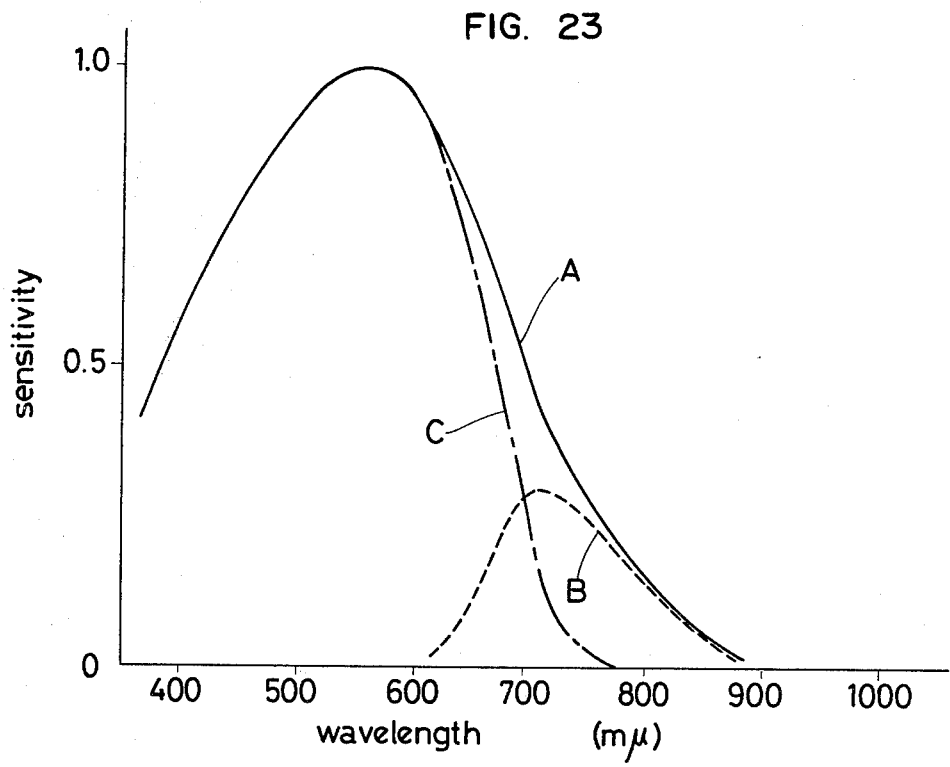
FIG. 23 is a graph showing a spectral sensitivity characteristic of the photoelectric semiconductor device of FIG. 21.

The second photoelectric element 103, having the smaller light receiving area, shows the spectral sensitivity as shown by a curve B in FIG. 23. The first photoelectric element 102, having the larger light receiving area, shows the spectral sensitivity as shown by a curve A in FIG. 23. Since the two photoelectric elements 102 and 103 are connected to each other in the parallel fashion, the total spectral sensitivity of the photoelectric semiconductor device of FIG. 21 exhibits the characteristic as shown by a curve C in FIG. 23.

Figure 26:
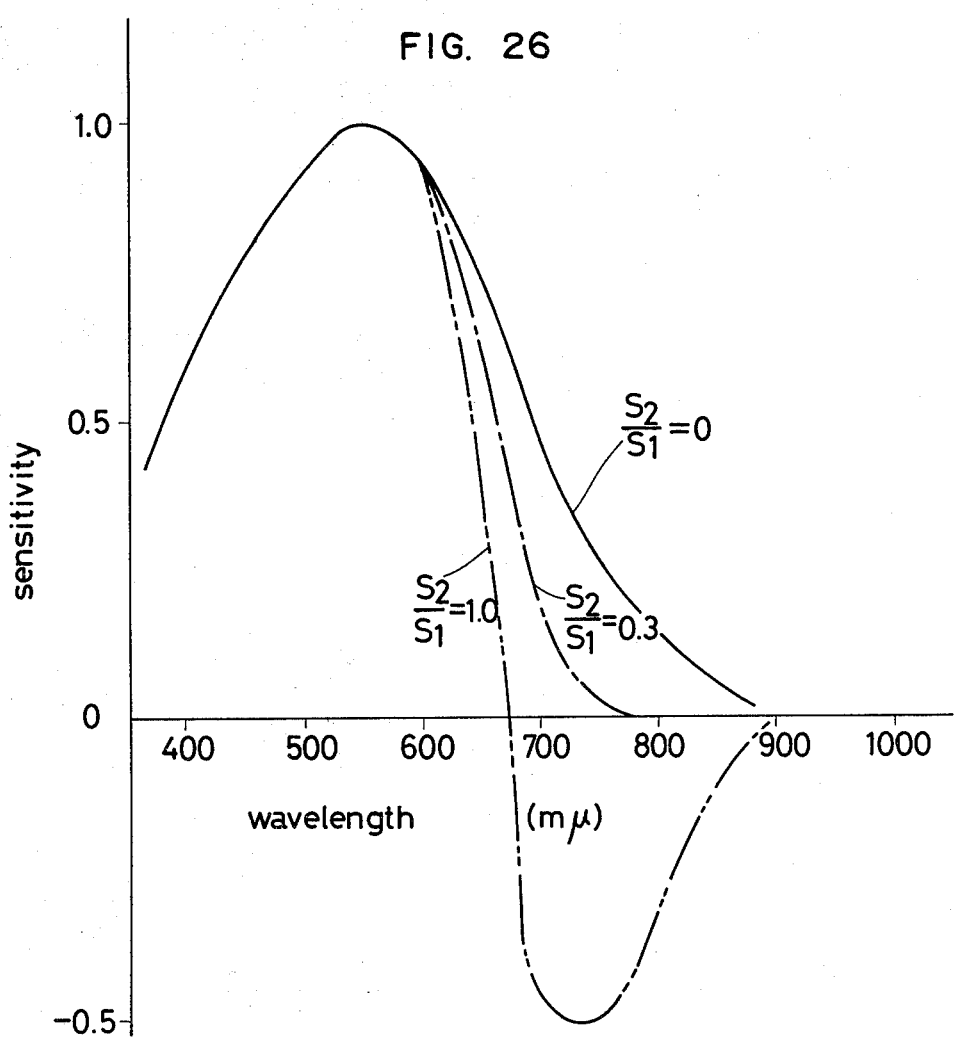
FIG. 26 is a graph showing a spectral sensitivity characteristic of the photoelectric semiconductor device of FIG. 21.

FIG. 26 shows the variation of the spectral sensitivity due to the ratio $S_2/S_1$ of the effective light receiving areas of the two photoelectric elements 102 and 103.

Figure 24:
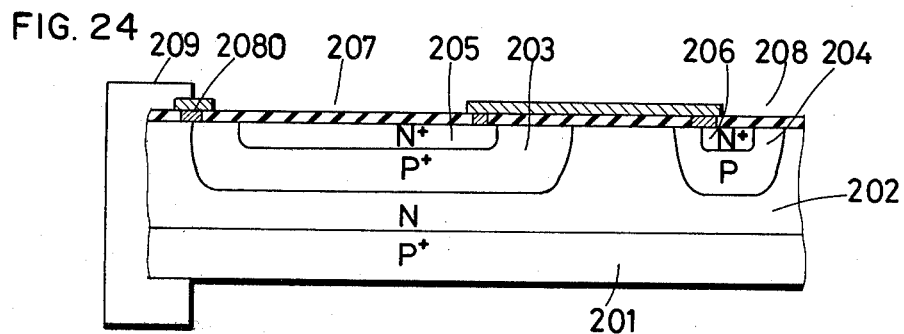
FIG. 24 is a sectional view of a twelfth embodiment of a photoelectric semiconductor device of the present invention.

FIG. 24 shows a twelfth embodiment of a photoelectric semiconductor device of the present invention.

An N type epitaxial layer 202 is grown in a P+ semiconductor substrate 201. P+ diffusion layers 203 and 204 are formed in the N type epitaxial layer 202. Then, N+ diffusion layers 205 and 206 are formed in the P+ diffusion layers 203 and 204, respectively. The N type epitaxial layer 202, the P+ diffusion layer 203 and the N+ diffusion layer 205 form, in combination, a first photoelectric element 207. The N type epitaxial layer 202, the P+ diffusion layer 204 and the N+ diffusion layer 206 form, in combination, a second photoelectric element 208. An aluminum conductor 2080 is formed on the surface to shunt the first PN junction of the first photoelectric element 207. The thus formed aluminum conductor 2080 is electrically connected to the P+ semiconductor substrate 201 via a conductor 209. Since the P+ semiconductor substrate 201 is electrically connected to the N type epitaxial layer 202 through the conductor 209, a third PN junction formed between the P+ semiconductor substrate 201 and the N type epitaxial layer 202 is shunted. That is, the spectral sensitivity is further reduced in the longer wavelength zone.

Figure 25:
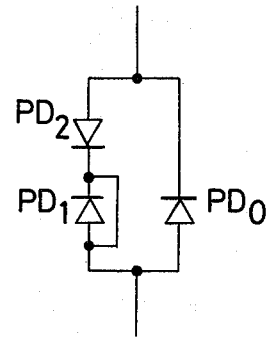
FIG. 25 is a circuit diagram of an equivalent circuit of a thirteenth embodiment of a photoelectric semiconductor device of the present invention.

FIG. 25 shows an equivalent circuit of a thirteenth embodiment of a photoelectric semiconductor device of the present invention, wherein the second photoelectric semiconductor element comprises a conventional photodiode $PD_0$. In this embodiment, the photodiode $PD_0$ is preferably constructed to show the characteristic which reduces the spectral sensitivity of the first photoelectric semiconductor element in the longer wavelength zone.

Figure 27:
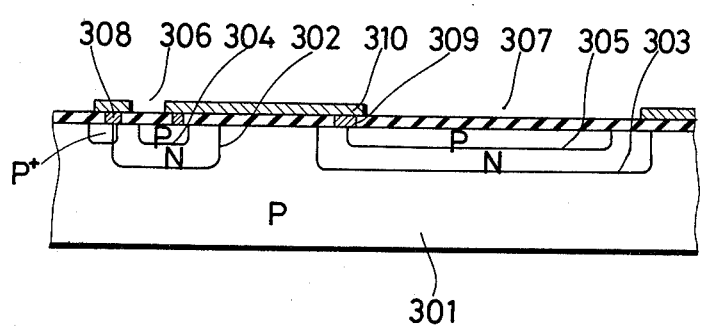
FIG. 27 is a sectional view of a fourteenth embodiment of a photoelectric semiconductor device of the present invention.

FIG. 27 shows a fourteenth embodiment of a photoelectric semiconductor device of the present invention, wherein the spectral sensitivity is reduced in the shorter wavelength zone.

A first photoelectric element 306 including a first PN junction 302 and a second PN junction 304, and a second photoelectric element 307 including a first PN junction 303 and a second PN junction 305 are formed in a silicon semiconductor substrate 301. An aluminum conductor 308 functions to shunt the first PN junction 302 of the first photoelectric element 306. An aluminum conductor 309 functions to shunt the second PN junction 305 of the second photoelectric element 307.

To increase the spectral sensitivity in the longer wavelength zone, the second photoelectric element 307 is constructed to have an effective light receiving area $S_2$ larger than an effective light receiving area $S_1$ of the first photoelectric element 306. For example, $S_1/S_2=0.2$. The two photoelectric elements 306 and 307 are electrically connected to each other through a conductor 310.

Figure 28:
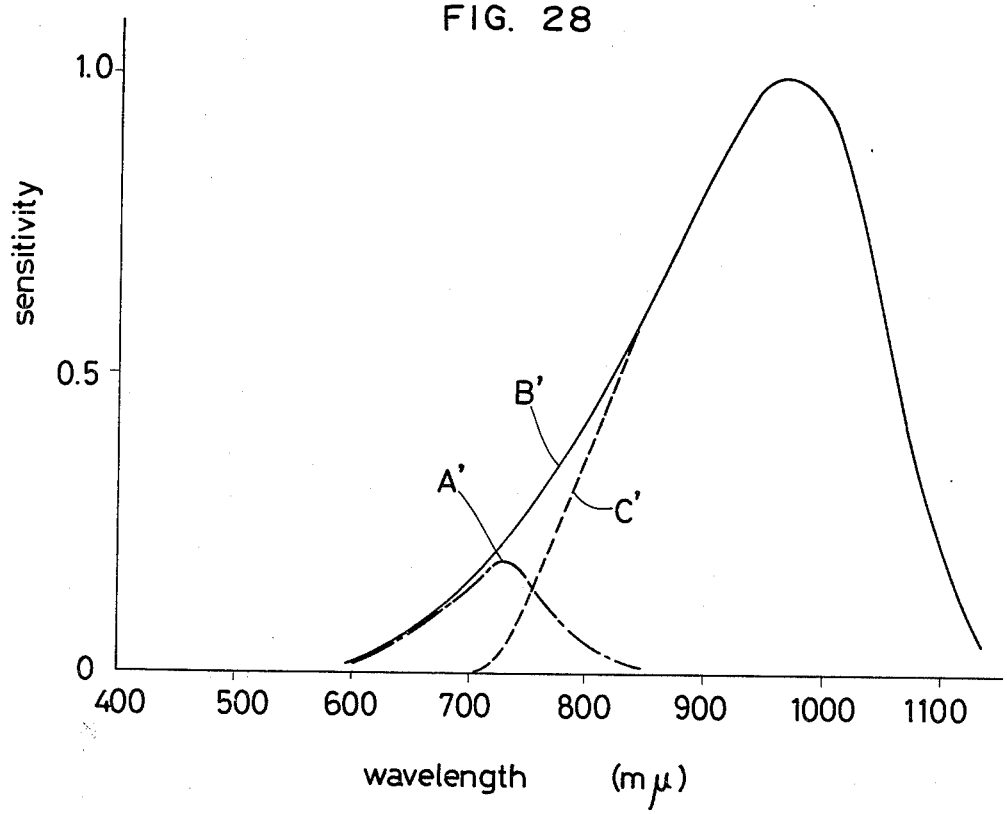
FIGS. 28 and 29 are graphs showing spectral sensitivity characteristics of the photoelectric semiconductor device of FIG. 27.

FIG. 28 shows the spectral sensitivity characteristic of the photoelectric semiconductor device of FIG. 27.

The first photoelectric element 306, having the smaller light receiving area, exhibits the spectral sensitivity as shown by a curve A' in FIG. 28. The second photoelectric element 307, having the larger light receiving area, shows the spectral sensitivity as shown by a curve B' in FIG. 28. Since the two photoelectric elements 306 and 307 are connected to each other via the conductor 310, the total spectral sensitivity of the photoelectric semiconductor device of FIG. 27 shows the characteristic as shown by a curve C' in FIG. 28.

Figure 29:
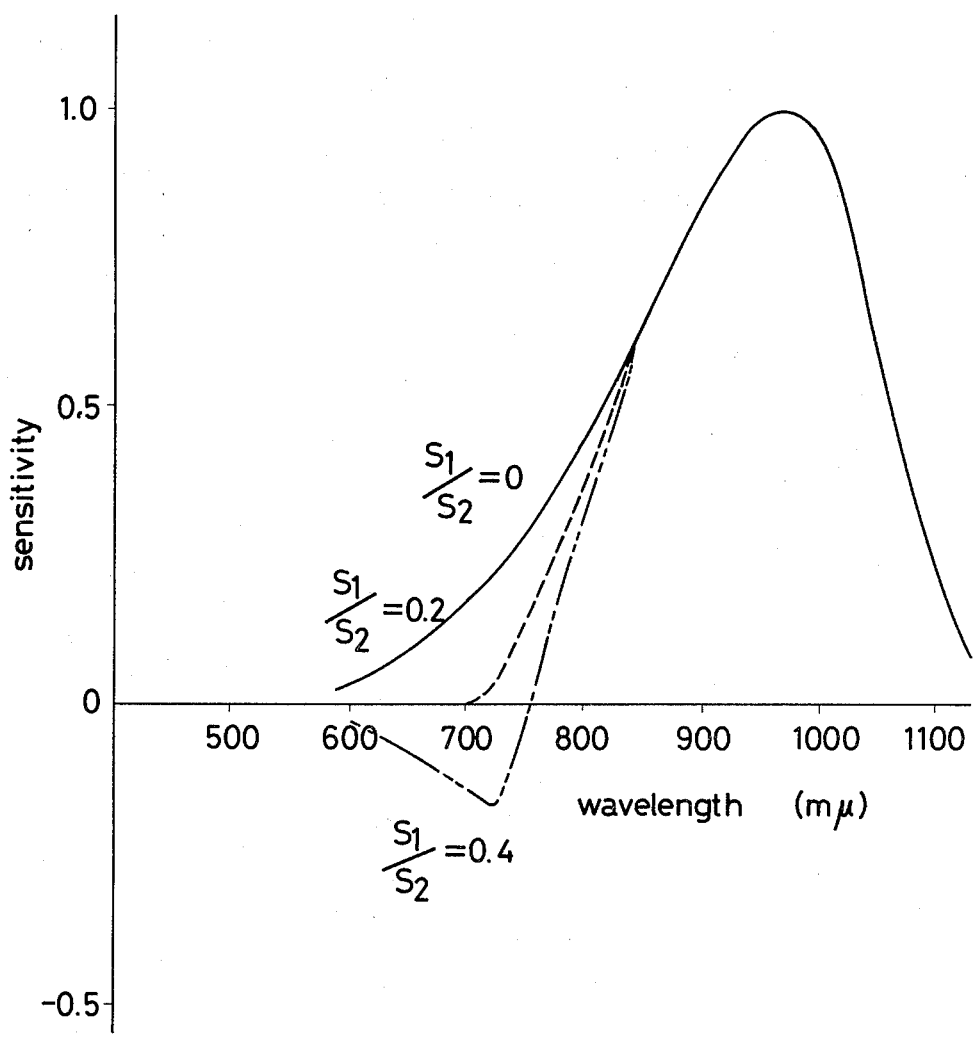

FIG. 29 shows the variation of the total spectral sensitivity of the photoelectric semiconductor device of FIG. 27 due to the variation of the ratio $S_1/S_2$ of the effective light receiving area sizes of the two photoelectric elements 306 and 307.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A photoelectric semiconductor device comprising:
   a semiconductor substrate of a first conductivity type;
   a first impurity region of a second conductivity type opposite to the first conductivity type formed in said semiconductor substrate;
   a first PN junction formed between said semiconductor substrate and said first impurity region;
   a second impurity region of the first conductivity type shallowly formed in said first impurity region;
   a second PN junction formed between said first impurity region and said second impurity region;

a first output electrode connected to said semiconductor substrate;

a second output electrode connected to said first impurity region;

a third output electrode connected to the second impurity region; and wherein said first and second output electrodes are output electrodes of a first photodiode associated with said first PN junction, said second and third output electrodes are output electrodes of a second photodiode associated with said second PN junction; and an opaque film formed on the semiconductor device at a position where said first PN junction reaches the surface of said semiconductor substrate, said opaque film shielding said first PN junction from light impinging thereon.

2. The photoelectric semiconductor device of claim 1, wherein said opaque film comprises an aluminum layer formed on transparent insulator layer which is formed on the surface of said semiconductor substrate.

3. The photoelectric semiconductor device of claim 2, wherein said aluminum layer is electrically connected to said first output electrode.

4. The photoelectric semiconductor device of claim 1, 2 or 3, wherein said second and third output electrodes are electrically connected to each other to shunt said second PN junction, thereby reducing a spectral sensitivity in a shorter wavelength zone.

5. The photoelectric semiconductor device of claim 1, 2 or 3, further comprising:

an aluminum conductor formed on the semiconductor device for electrically connecting said second and third output electrodes.

6. The photoelectric semiconductor device of claim 1, 2 or 3, wherein said first and second output electrodes are electrically connected to each other to shunt said first PN junction, thereby reducing a spectral sensitivity in a longer wavelength zone.

7. The photoelectric semiconductor device of claim 1, 2 or 3, further comprising:

an aluminum conductor formed on the semiconductor device for electrically connecting said first and second output electrodes.

8. A photoelectric semiconductor device comprising:

a common semiconductor substrate;

a first photoelectric element formed in said common semiconductor substrate, said first photoelectric element including;

at least two PN junctions formed at first and second different depths from the surface of said common semiconductor substrate, the first depth being deeper than the second depth;

first conductor means for shunting the one of said PN junctions formed in the first deeper depth from the surface of said common semiconductor substrate; and first output electrode means for developing an output signal derived from another PN junction formed in the second shallower depth from the surface of said common semiconductor substrate;

a second photoelectric element formed in said common semiconductor substrate, said second photoelectric element being separate from said first photoelectric element, said second photoelectric element including;

at least two PN junctions formed at first and second different depths from the surface of said common semiconductor substrate, the first depth being deeper than the second depth;

second conductor means for shunting the one of said PN junctions formed in the second shallower depth from the surface of said common semiconductor substrate; and second output electrode means for developing an output signal derived from another PN junction formed in the first deeper depth from the surface of said common semiconductor substrate; and third conductor means for connecting said first and second photoelectric elements in a parallel fashion.

9. The photoelectric semiconductor device of claim 8, wherein said first photoelectric element has an effective light receiving surface larger than that of said second photoelectric element.

10. The photoelectric semiconductor device of claim 8, wherein said second photoelectric element has an effective light receiving surface larger than that of said first photoelectric element.

11. A photoelectric semiconductor device comprising:

a common semiconductor substrate;

a first photoelectric element formed in said common semiconductor substrate, said first photoelectric element including;

at least two PN junctions formed at first and second different depths from the surface of said common semiconductor substrate, the first depth being deeper than the second depth;

conductor means for shunting the one of said PN junctions formed in the first deeper depth from the surface of said common semiconductor substrate; and output electrode means for developing an output electrode means for developing an output signal derived from another PN junction formed in the second shallower depth from the surface of said common semiconductor substrate;

a second photoelectric element formed in said common semiconductor substrate, said second photoelectric element exhibiting a spectral sensitivity peak in a longer wavelength zone with respect to said first photoelectric element; and signal developing means for connecting said first and second photoelectric elements in a parallel fashion.

* * * * *